(12) United States Patent
Kang et al.

(10) Patent No.: US 12,125,730 B2
(45) Date of Patent: Oct. 22, 2024

(54) APPARATUS AND METHODS FOR DETERMINING WAFER CHARACTERS

(71) Applicant: Taiwan Semiconductor Manufacturing Co., Ltd., Hsin-Chu (TW)

(72) Inventors: Wei-Da Kang, Hsin-Chu (TW); Wen-Ting Tsai, Taipei (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 17/740,816

(22) Filed: May 10, 2022

(65) Prior Publication Data

US 2022/0270905 A1 Aug. 25, 2022

Related U.S. Application Data

(62) Division of application No. 17/208,850, filed on Mar. 22, 2021, now Pat. No. 11,380,570, which is a division of application No. 16/118,239, filed on Aug. 30, 2018, now Pat. No. 10,957,571.

(51) Int. Cl.
| | |
|---|---|
| *H01L 21/68* | (2006.01) |
| *H01L 21/677* | (2006.01) |
| *H01L 23/544* | (2006.01) |
| *H05K 13/08* | (2006.01) |

(52) U.S. Cl.
CPC ...... *H01L 21/681* (2013.01); *H01L 21/67736* (2013.01); *H01L 21/67778* (2013.01); *H01L 23/544* (2013.01); *H05K 13/0812* (2018.08); *H01L 2223/54426* (2013.01)

(58) Field of Classification Search
CPC ............ H01L 21/681; H01L 21/67736; H01L 21/67778; H01L 23/544; H01L 2223/54426; H01L 21/67294; H01L 21/02; H01L 21/67011; H01L 21/67703; H01L 22/12; H05K 13/0812
See application file for complete search history.

(56) References Cited

U.S. PATENT DOCUMENTS

| | | | |
|---|---|---|---|
| 5,870,488 A | 2/1999 | Rush | |
| 2004/0207836 A1* | 10/2004 | Chhibber | G01N 21/8806 356/237.4 |

(Continued)

FOREIGN PATENT DOCUMENTS

| | | |
|---|---|---|
| CN | 1455436 A | 11/2003 |
| CN | 203800022 U | 8/2014 |

(Continued)

*Primary Examiner* — Matthew Mikels
(74) *Attorney, Agent, or Firm* — Duane Morris LLP

(57) ABSTRACT

Apparatus and methods for determining wafer characters are disclosed. In one example, an apparatus is disclosed. The apparatus includes: a processing tool configured to process a semiconductor wafer; a device configured to read an optical character disposed on the semiconductor wafer while the semiconductor wafer is located at the apparatus for wafer fabrication; and a controller configured to determine whether the optical character matches a predetermined character corresponding to the semiconductor wafer based on the optical character read in real-time at the apparatus.

20 Claims, 9 Drawing Sheets

(56) References Cited

U.S. PATENT DOCUMENTS

| | | | |
|---|---|---|---|
| 2005/0194987 A1* | 9/2005 | Yang | G01R 31/2601 |
| | | | 324/750.15 |
| 2005/0251781 A1 | 11/2005 | Kotani | |
| 2009/0082895 A1 | 3/2009 | Barker | |
| 2013/0028691 A1 | 1/2013 | Tabrizi et al. | |
| 2016/0313256 A1* | 10/2016 | Sullivan | G02B 13/0095 |

FOREIGN PATENT DOCUMENTS

| | | | |
|---|---|---|---|
| JP | H06342837 A | 12/1994 | |
| KR | 20180000423 A | 1/2018 | |
| TW | 389952 B | 5/2000 | |
| TW | 392071 B | 6/2000 | |
| TW | 200532440 A | 10/2005 | |
| TW | 200707620 A | 2/2007 | |
| TW | 200715360 A | 4/2007 | |
| TW | 200834649 A | 8/2008 | |
| TW | 200901348 A | 1/2009 | |
| TW | 201405437 A | 2/2014 | |
| WO | 2002/052639 A1 | 7/2002 | |
| WO | 2016/097080 A1 | 6/2016 | |

\* cited by examiner

APPARATUS AND METHODS FOR DETERMINING WAFER CHARACTERS

CROSS-REFERENCE TO RELATED APPLICATIONS

This application is a divisional of U.S. patent application Ser. No. 17/208,850, filed Mar. 22, 2021, which is a divisional of U.S. patent application Ser. No. 16/118,239, filed on Aug. 30, 2018, all of which are incorporated by reference herein in their entireties.

BACKGROUND

Semiconductor integrated circuits wafers are produced by a plurality of processes in a wafer fabrication facility ("FAB"). To properly identify these wafers, identification marks must be suitably placed on the wafer such that the wafers can be readily identified throughout the fabrication processes. The fabrication processes may include as many as several hundred processing steps, e.g. thermal oxidation, diffusion, ion implantation, rapid thermal processing (RTP), chemical vapor deposition (CVD), physical vapor deposition (PVD), epitaxy, etch, and photolithography, which are conducted at different processing stations by different wafer fabrication tools (i.e., "processing tools"). A reliable method of identification of these wafers by their lot numbers and/or wafer identification (ID) numbers is therefore very important not only from a production control point of view, but also for future tracking of the semiconductor devices that are built when a quality issue or discrepancy arises.

In existing methods, to check a wafer ID of a wafer being processed by a processing tool, the wafer needs to be transported to a different tool for determining whether there is a mismatch between the detected wafer ID and a predetermined wafer ID corresponding to this wafer and for generating a wafer mismatch alarm in response to a mismatch. This causes a long handling time, which often induces a wafer scrap when the time exceeds a threshold, e.g. a threshold related to an out of specification (OOS) event and/or a quench time (Q-time) over event. There is no effective method to solve the above mentioned problems.

BRIEF DESCRIPTION OF THE DRAWINGS

Aspects of the present disclosure are best understood from the following detailed description when read with the accompanying figures. It is noted that various features are not necessarily drawn to scale. In fact, the dimensions and geometries of the various features may be arbitrarily increased or reduced for clarity of discussion. Like reference numerals denote like features throughout specification and drawings.

DETAILED DESCRIPTION

Figure 1:
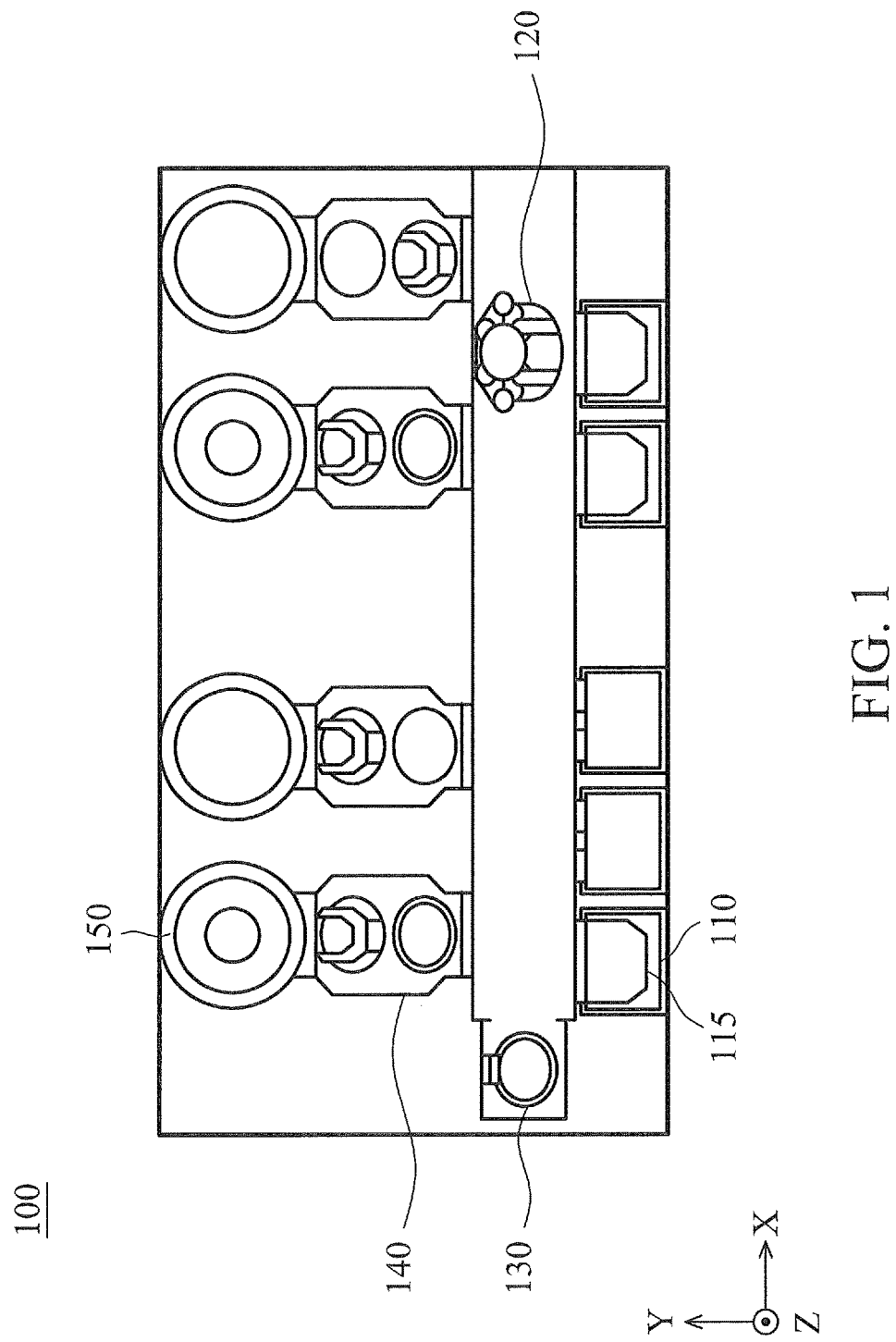
FIG. 1 illustrates a top view diagram of an exemplary apparatus for processing a wafer, in accordance with some embodiments of the present disclosure.

The following disclosure describes various exemplary embodiments for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Terms such as "attached," "affixed," "connected" and "interconnected," refer to a relationship wherein structures are secured or attached to one another either directly or indirectly through intervening structures, as well as both movable or rigid attachments or relationships, unless expressly described otherwise.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Reference will now be made in detail to the present embodiments of the disclosure, examples of which are illustrated in the accompanying drawings. Wherever possible, the same reference numbers are used in the drawings and the description to refer to the same or like parts.

Integrated circuits are typically fabricated by processing one or more wafers as a "lot" with a series of wafer fabrication tools (i.e., "processing tools"). Wafer lot identities (IDs) are provided to monitor and control the wafer lots among various fabrication tools and automated systems via a manufacturing execution system (MES) or a management information system (MIS). Several wafers can be identified by a common lot identifier (the lot ID) and wafers in the same lot may be given individual identifiers (the wafer ID). A wafer carries an identification mark that typically is made up of the lot ID and a wafer ID. The identifier is commonly generated by a computer program. An identification mark may include one or more characters readable by an optical character recognition (OCR) system.

To quickly check an identification mark on a wafer, the present teaching discloses apparatuses and methods to add an OCR system on or coupled to a wafer processing tool that can read wafer identification marks or codes in real-time and reduce or avoid wafer scrap induced by a Q-time over event, in which a process runs past a predetermined Q-time threshold. In one embodiment, a disclosed apparatus includes a processing tool configured for processing a wafer, a device, and a controller. The device may be an OCR device configured to convert one or more images of typed, handwritten, or printed text into machine readable text. In one embodiment, the OCR device is configured for reading an optical character, which may be typed, handwritten, or printed text representing at least part of an identification mark of the wafer, disposed on the wafer. The controller is configured for determining whether the optical character matches a predetermined character corresponding to the wafer. In response to a determination that there is a mismatch between the optical character and the predetermined character, the apparatus may inform a transport tool to transport a wafer carrier including the wafer to a fixing tool for fixing the mismatch. In response to a determination that there is no mismatch between the optical character and the predetermined character, the apparatus may record that the wafer passed a mismatch check of the optical character.

According to various embodiments of the present teaching, the OCR device is configured for reading the optical character based on at least one of: a visible light, an invisible light, a laser, an infrared light, an ultraviolet light, a microwave, an X-ray, or a Gamma ray. According to various embodiments of the present teaching, the OCR device may be located at any position of the apparatus, e.g. on an orientator of the processing tool configured for turning all wafers to a same predetermined direction before processing them at the processing tool, on a load port configured for loading wafers into the processing tool and unloading wafers out of the processing tool, or any other places on the processing tool.

According to various embodiments of the present teaching, the OCR device on the apparatus is configured for reading the optical character before the wafer is processed in the processing tool, after the wafer is processed in the processing tool, or while the wafer is being processed in the processing tool. Accordingly, the OCR device may be configured for reading the optical character while the wafer is under a gaseous pressure equal to a vacuum pressure, a partial vacuum pressure, an atmospheric pressure, or any other pressure value.

FIG. 1 illustrates a top view diagram of an exemplary apparatus 100 for processing a wafer, in accordance with some embodiments of the present disclosure. As shown in FIG. 1, the apparatus 100 includes one or more load ports 110, a conveying mechanism 120, an orientator 130, one or more pumping systems 140, and one or more chambers 150. In one example, the portion of the apparatus 100 excluding the one or more load ports 110 may be referred to as a wafer processing tool.

Each load port 110 may receive a wafer carrier 115 from a transport tool and load at least one wafer contained in the wafer carrier 115 into the wafer processing tool, along direction Y, for processing the at least one wafer. The wafer carrier 115 has a door that can be opened, stored and closed by a mechanism on the load port 110. The wafer processing tool is coupled to the load port 110 for retrieving and processing at least one wafer in the wafer carrier 115 whose door has been opened and stored. According to various embodiments, the wafer processing tool may be a manufacturing apparatus, a visual inspection apparatus, an electrical characteristic test apparatus, etc. The load port 110 may also unload the wafer carrier 115 after the at least one wafer in the wafer carrier 115 is processed. The transport tool may then transport the unloaded wafer carrier 115 to another load port for further processing of at least one wafer in the wafer carrier 115.

To properly identify wafers throughout the fabrication processes, an identification mark or code, e.g. a wafer ID, can be placed on each wafer. A client may use the wafer IDs to query processing status, projected finish date, engineering data or directly execute limited process control, such as holding a wafer or banking a wafer. The wafer ID may include one or more characters and may be encoded with reference to a manufacturing fab, wafer created date, related lot ID, or sequence number. To quickly check an identification mark on a wafer, the apparatus 100 may include an OCR device that can read the wafer ID disposed on the wafer in real-time and reduce or avoid wafer scrap induced by a Q-time over event, in which a process runs past a predetermined Q-time threshold. For example, the OCR device can an image of wafer ID disposed on the wafer into machine readable text to read the wafer ID.

In one embodiment, the OCR device (not shown in FIG. 1) is located at the load port 110. The OCR device in this embodiment scans the wafer to read one or more optical characters representing a wafer ID while the wafer is being loaded and/or unloaded by the load port 110.

In another embodiment, the OCR device is located at the wafer processing tool, e.g. at the conveying mechanism 120, the orientator 130, the one or more pumping systems 140, the one or more chambers 150, or any other place of the wafer processing tool. The OCR device in this embodiment scans the wafer to read one or more optical characters representing a wafer ID of the wafer before the wafer is processed in the processing tool, after the wafer is processed in the processing tool, or while the wafer is being processed in the processing tool.

As shown in FIG. 1, the apparatus 100 includes multiple load ports 110 that can load wafers into the same processing tool. The conveying mechanism 120 of the processing tool can convey wafers between load ports, between a load port and a location in the processing tool, and between different locations of the processing tool. In one example, after the load port 110 loads the wafer carrier 115, the conveying mechanism 120 can receive a wafer from the wafer carrier 115 and convey it to the orientator 130 for orientation adjustment.

The orientator 130 in this example receives one or more wafers from the conveying mechanism 120, and turns each wafer received to a predetermined direction. For example, each wafer has a direction mark disposed on or near an edge of the wafer. Then the orientator 130 can adjust an orientation of each wafer by turning the wafer to make its direction mark pointing to the direction Y. In one embodiment, the OCR device is located at the orientator 130 and scans each wafer to read its wafer ID while the wafer is being turned by the orientator 130. This is convenient because the orientator 130 has a rotating mechanism already installed thereon to rotate a wafer. The rotating mechanism can rotate the wafer to help the OCR device to read the wafer ID and help the wafer orientation adjustment at the same time.

After the orientator 130 adjusts the orientation of a wafer, the conveying mechanism 120 can convey the wafer from the orientator 130 to a pumping system 140. As shown in FIG. 1, each pumping system 140 corresponds to a chamber 150. The pumping system 140 in this example can modify a gaseous pressure in the corresponding chamber 150. After the gaseous pressure in the corresponding chamber 150 reaches a predetermined level, the wafer may be sent into the chamber 150 for processing. In another example, the wafer is first transferred into the chamber 150 before the pumping system 140 pumps the chamber 150 to a predetermined gaseous pressure level, e.g. a vacuum pressure, a partial vacuum pressure, an atmospheric pressure, or any other pressure level.

According to various embodiments, the OCR device is located at an outside wall of the chamber 150, the pumping system 140, or the conveying mechanism 120. In general, the OCR device may be located at any position of the apparatus 100 except in a plasma environment. Accordingly, the OCR device can scan each wafer to read its wafer ID while the wafer is under a gaseous pressure equal to a vacuum pressure, a partial vacuum pressure, an atmospheric pressure, or any other pressure level. The OCR device may read the wafer ID based on at least one of: a visible light, an invisible light, a laser, an infrared light, an ultraviolet light, a microwave, an X-ray, or a Gamma ray.

In one embodiment, the apparatus 100 also includes a controller (not shown FIG. 1). The controller may be disposed at any location of the apparatus 100. The controller may also be separate from the apparatus 100 but electrically or mechanically connected to the apparatus 100, and particularly connected to the OCR device. After the OCR device reads the wafer ID or any other optical character on the wafer, it sends the optical character to the controller which can determine whether the optical character matches a predetermined character corresponding to the wafer. In response to a determination that there is a mismatch between the optical character and the predetermined character, the controller may inform a transport tool to transport a wafer carrier including the wafer to a fixing tool for fixing the mismatch. In response to a determination that there is no mismatch between the optical character and the predetermined character, the controller may record that the wafer passed a mismatch check of the optical character.

Figure 2:
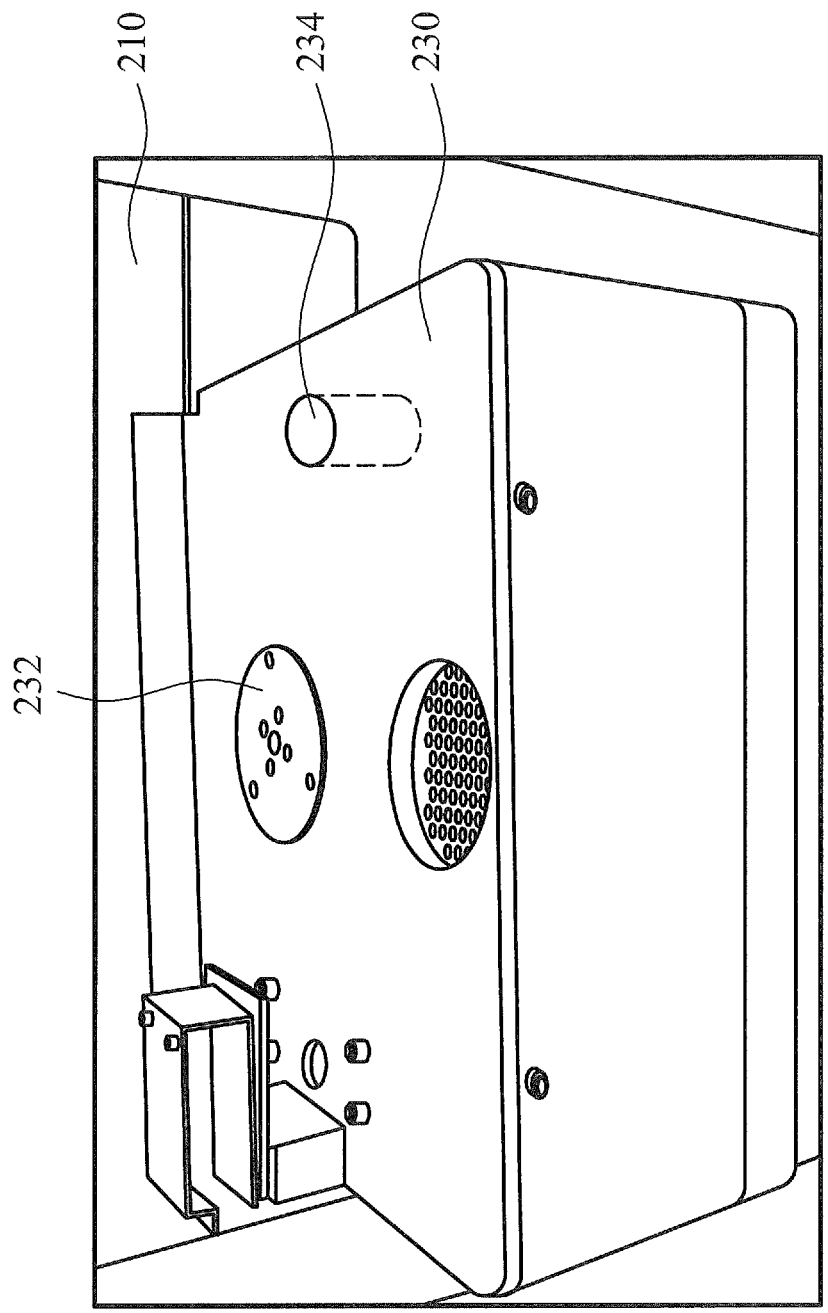
FIG. 2 illustrates an exemplary orientator on a wafer processing tool, in accordance with some embodiments of the present disclosure.

FIG. 2 illustrates an exemplary orientator on a wafer processing tool, in accordance with some embodiments of the present disclosure. FIG. 2 shows a portion of an apparatus 200 that includes a wafer processing tool 210 and an orientator 230 coupled to the wafer processing tool 210. In one example, the orientator 230 has a same structure as the orientator 130 in FIG. 1.

The orientator 230 includes a rotating mechanism installed at the location 232 and configured for turning all wafers to a same predetermined direction before processing them at the processing tool 210. For example, the orientator 230 can adjust an orientation of each wafer by turning the wafer to align the wafer's direction mark to point to the same direction Y.

The orientator 230 in this example also includes an OCR device 234 configured for reading an optical character, e.g. a wafer ID, disposed on the wafer. The OCR device 234 can scan each wafer to read its wafer ID while the wafer is being turned by the rotating mechanism. As such, the rotating mechanism can rotate the wafer to help the OCR device 234 to read the wafer ID and help the wafer orientation adjustment at the same time, which saves lots of time compared to placing the OCR device at another independent processing tool. The OCR device 234 in this example is located at the top of the orientator 230. The OCR device 234 may also be located within the orientator 230, coupled to a side wall of the orientator 230, or located at other places of the orientator 230.

Figure 3:
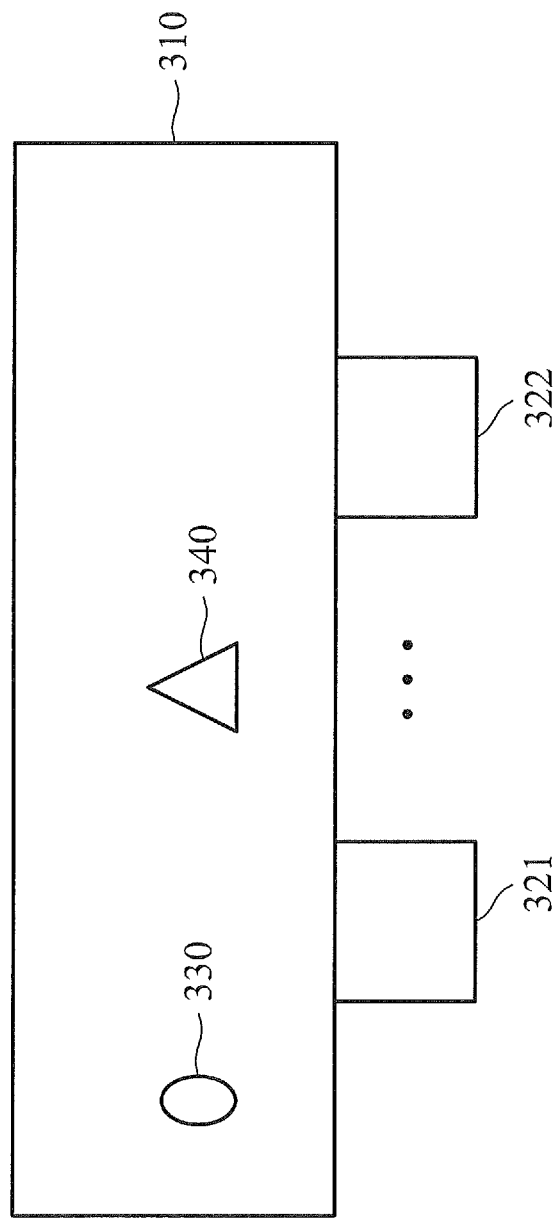
FIG. 3 illustrates an exemplary diagram of an apparatus for processing wafers and determining wafer characters, in accordance with some embodiments of the present disclosure.

FIG. 3 illustrates an exemplary diagram of an apparatus 300 for processing wafers and determining wafer characters, in accordance with some embodiments of the present disclosure. As shown in FIG. 3, the apparatus 300 includes a wafer processing tool 310 and a plurality of load ports 321, 322 configured for loading wafers into the wafer processing tool 310 to process the wafers and unloading the wafers from the wafer processing tool 310 after the wafers are processed.

In this example, the apparatus 300 includes a device 330, e.g. an OCR device, located at the wafer processing tool 310 and configured for reading an optical character, e.g. a wafer ID, disposed on a wafer. In addition, the apparatus 300 includes a controller 340 located at the wafer processing tool 310 and configured for determining whether the optical character matches a predetermined character corresponding to the wafer. The controller 340 is electrically or wirelessly connected to the OCR device 330 to receive detected optical character by the OCR device 330. After determining that there is a mismatch between the optical character and the predetermined character, the controller 340 may inform a transport tool to transport a wafer carrier including the wafer to a fixing tool for fixing the mismatch. After determining that there is no mismatch between the optical character and the predetermined character, the controller 340 may record that the wafer passed a mismatch check of the optical character. In accordance with various embodiments, the controller 340 can include a processor for performing the mismatch check and a memory for recording the mismatch check results.

Figure 4:
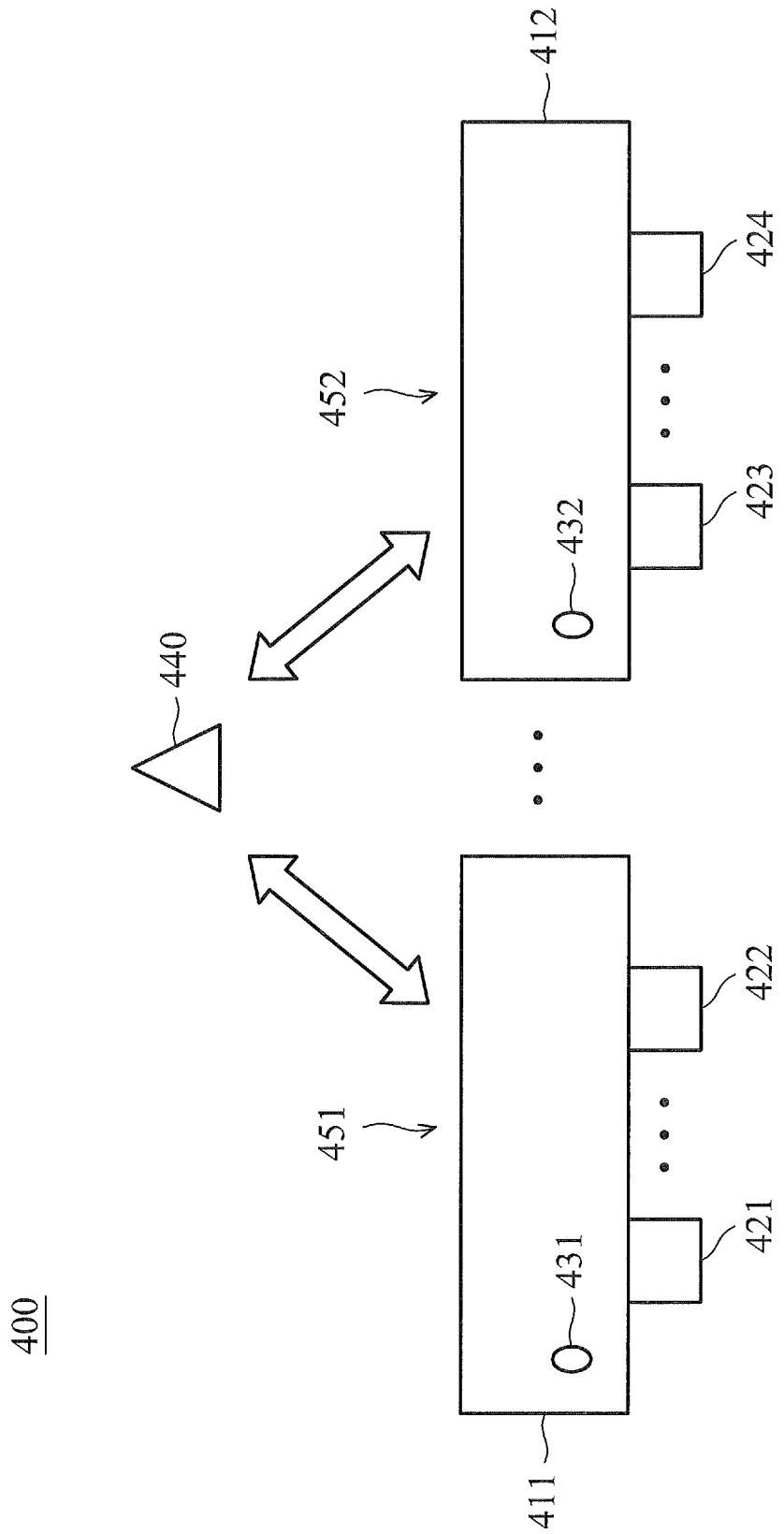
FIG. 4 illustrates exemplary diagrams of a plurality of apparatus for processing wafers and determining wafer characters, in accordance with some embodiments of the present disclosure.

FIG. 4 illustrates a system 400 including a plurality of apparatus 451, 452 for processing wafers and determining wafer characters, in accordance with some embodiments of the present disclosure. As shown in FIG. 4, each apparatus, e.g. the apparatus 451, includes a wafer processing tool 411 and a plurality of load ports 421, 422 configured for loading wafers into the wafer processing tool 411 to process the wafers and unloading the wafers from the wafer processing tool 411 after the wafers are processed.

In this example, each apparatus, e.g. the apparatus 451, includes a device 431, e.g. an OCR device, located at the wafer processing tool 411 and configured for reading an optical character, e.g. a wafer ID, disposed on a wafer. In addition, the system 400 includes a controller 440 separate from any of the plurality of apparatus 451, 452. The controller 440 may be a center controller shared by the plurality of apparatus 451, 452 and configured for determining whether the optical character read by each OCR device 431, 432 matches a predetermined character corresponding to the wafer. The controller 440 is electrically or wirelessly connected to the OCR devices 431, 432 to receive detected optical characters by the OCR devices 431, 432. After determining that there is a mismatch between an optical character detected by an OCR device on a wafer, e.g. the OCR device 431, and the predetermined character corresponding to the wafer, the controller 440 may inform a transport tool to transport a wafer carrier including the wafer to a fixing tool for fixing the mismatch. After determining that there is no mismatch between an optical character detected by an OCR device on a wafer, e.g. the OCR device 432, and the predetermined character corresponding to the wafer, the controller 440 may record that the wafer passed a mismatch check of the optical character.

Figure 5:
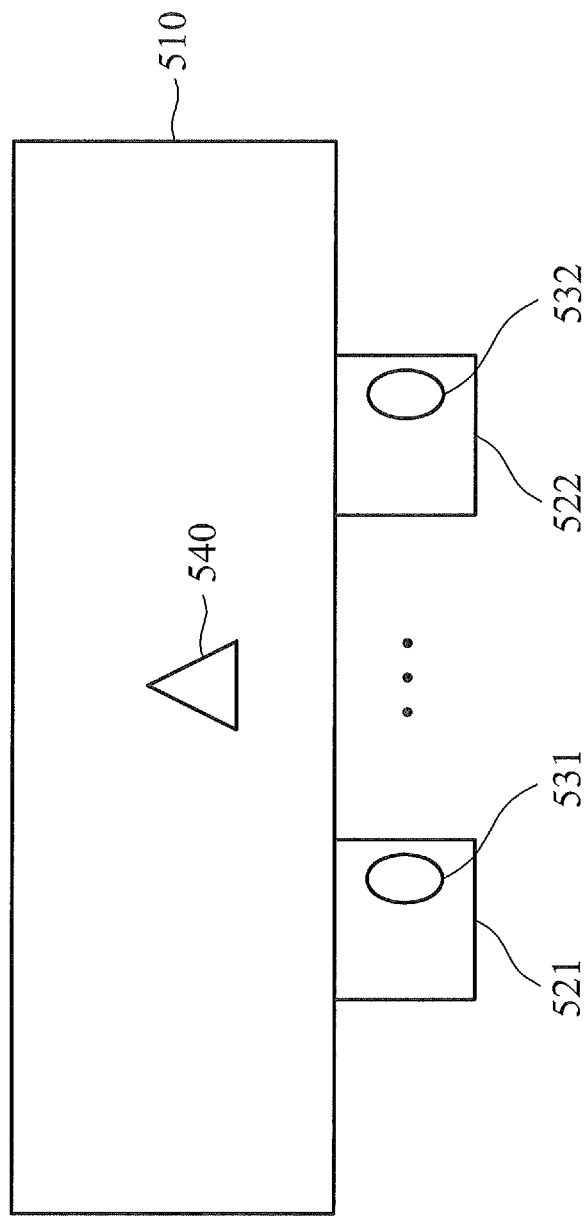
FIG. 5 illustrates another exemplary diagram of an apparatus for processing wafers and determining wafer characters, in accordance with some embodiments of the present disclosure.

FIG. 5 illustrates another exemplary diagram of an apparatus 500 for processing wafers and determining wafer characters, in accordance with some embodiments of the present disclosure. As shown in FIG. 5, the apparatus 500 includes a wafer processing tool 510 and a plurality of load ports 521, 522 configured for loading wafers into the wafer processing tool 510 to process the wafers and unloading the wafers from the wafer processing tool 510 after the wafers are processed.

In this example, each load port 521, 522 of the apparatus 500 includes a device 531, 532, e.g. an OCR device, located at the load port 521, 522 and configured for reading an optical character, e.g. a wafer ID, disposed on a wafer. In addition, the apparatus 500 includes a controller 540 located at the wafer processing tool 510 and configured for determining whether the optical character matches a predetermined character corresponding to the wafer. The controller 540 is electrically or wirelessly connected to the OCR devices 531, 532 to receive detected optical characters by the OCR devices 531, 532. After determining that there is a mismatch between an optical character detected by an OCR device on a wafer, e.g. the OCR device 531, and the predetermined character corresponding to the wafer, the controller 540 may inform a transport tool to transport a wafer carrier including the wafer to a fixing tool for fixing the mismatch. After determining that there is no mismatch between an optical character detected by an OCR device on a wafer, e.g. the OCR device 532, and the predetermined character corresponding to the wafer, the controller 540 may record that the wafer passed a mismatch check of the optical character.

Figure 6:
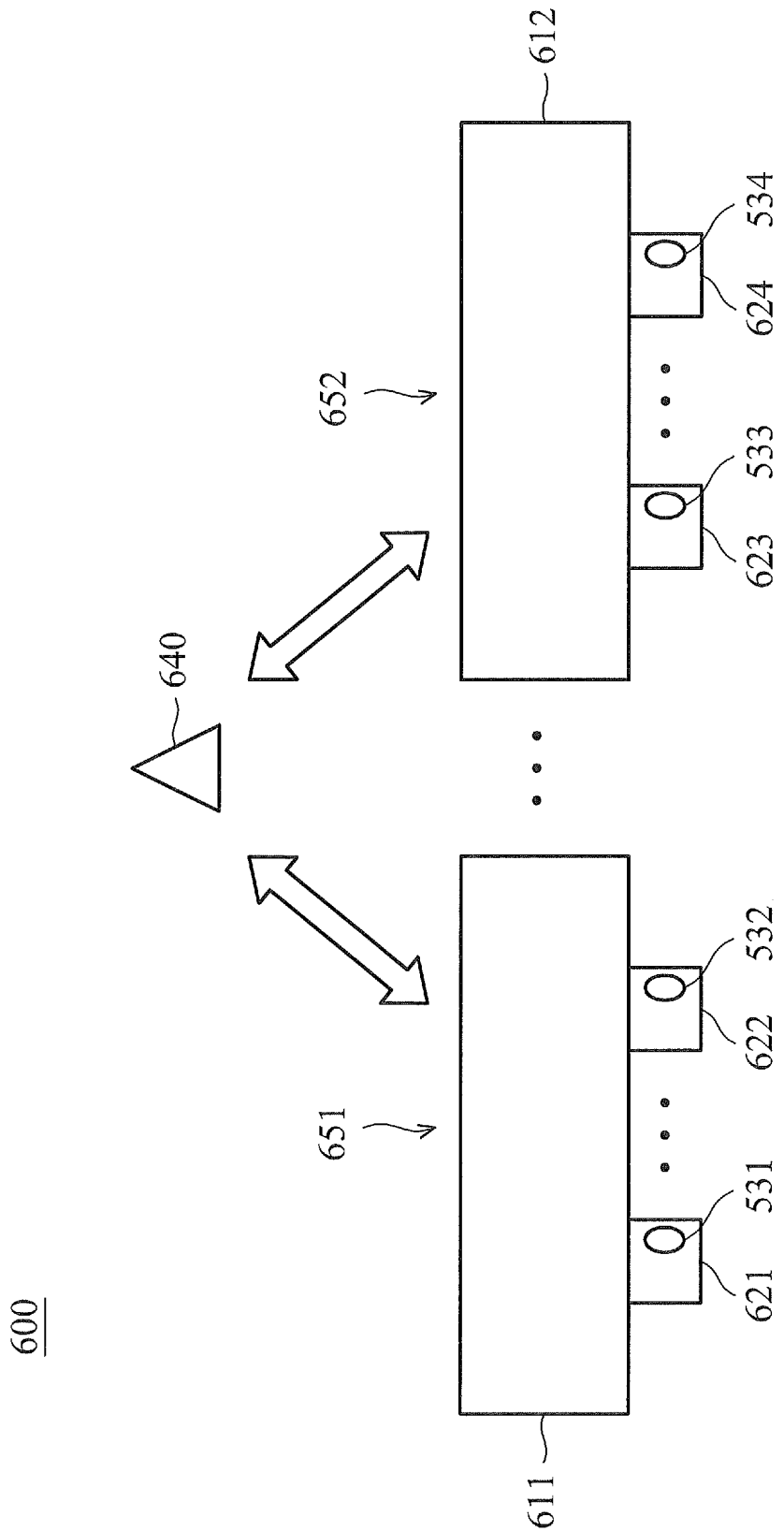
FIG. 6 illustrates exemplary diagrams of another plurality of apparatus for processing wafers and determining wafer characters, in accordance with some embodiments of the present disclosure.

FIG. 6 illustrates another system 600 including a plurality of apparatus 651, 652 for processing wafers and determining wafer characters, in accordance with some embodiments of the present disclosure. As shown in FIG. 6, each apparatus, e.g. the apparatus 651, includes a wafer processing tool 611 and a plurality of load ports 621, 622 configured for loading wafers into the wafer processing tool 611 to process the wafers and unloading the wafers from the wafer processing tool 611 after the wafers are processed. Similarly, the apparatus 652 includes a wafer processing tool 612 and a plurality of load ports 623, 624 configured for loading wafers into the wafer processing tool 612 to process the wafers and unloading the wafers from the wafer processing tool 612 after the wafers are processed.

In this example, each apparatus, e.g. the apparatus 651, includes a plurality of OCR devices 531, 532 each of which is located at a corresponding load port 621, 622 and configured for reading an optical character, e.g. a wafer ID, disposed on a wafer. In addition, the system 600 includes a controller 640 separate from any of the plurality of apparatus 651, 652. The controller 640 may be a central controller shared by the plurality of apparatus 651, 652 and configured for determining whether the optical character read by each OCR device 531, 532, 533, 534 matches a predetermined character corresponding to the wafer. The controller 640 is electrically or wirelessly connected to the OCR devices 531, 532, 533, 534 to receive detected optical characters by the OCR devices 531, 532, 533, 534. After determining that there is a mismatch between an optical character detected by an OCR device on a wafer, e.g. the OCR device 531, and the predetermined character corresponding to the wafer, the controller 640 may inform a transport tool to transport a wafer carrier including the wafer to a fixing tool for fixing the mismatch. After determining that there is no mismatch between an optical character detected by an OCR device on a wafer, e.g. the OCR device 533, and the predetermined character corresponding to the wafer, the controller 640 may record that the wafer passed a mismatch check of the optical character.

Figure 7:
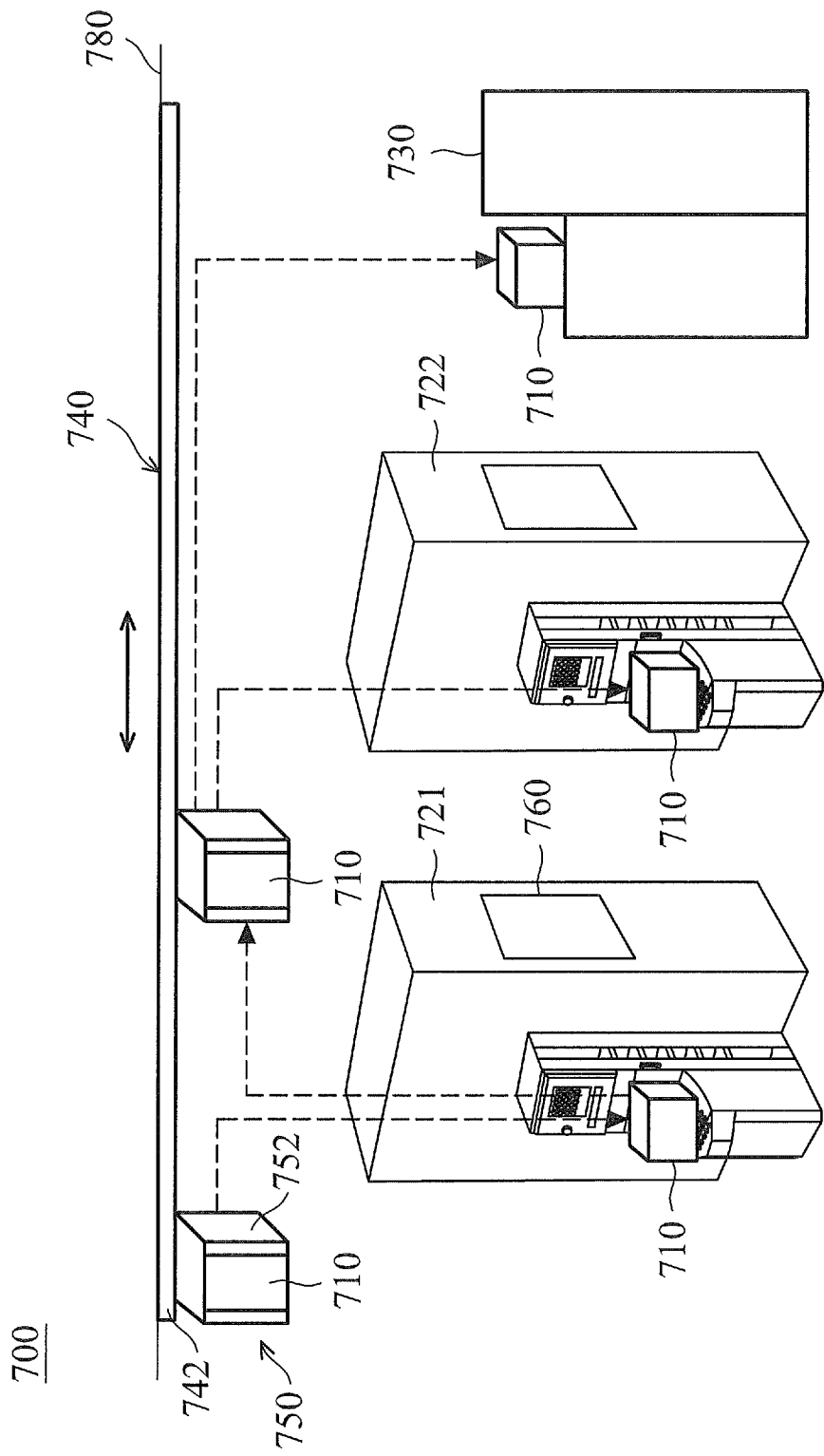
FIG. 7 illustrates a portion of a semiconductor FAB, in accordance with some embodiments of the present disclosure.

FIG. 7 illustrates a portion of a semiconductor FAB 700, in accordance with some embodiments of the present disclosure. The portion of the FAB 700 shown in FIG. 7 may be a schematic perspective diagram of an automatic material handling system (AMHS). Multiple wafers are typically stored and transported together in wafer carriers by the AMHS between load ports of different wafer processing or other tools during the semiconductor fabrication process. As shown in FIG. 7, the AMHS includes a wafer transport tool 740, e.g. an overhead hoist transport (OHT) system, a plurality of wafer processing apparatus 721, 722, each of which may be an apparatus as disclosed above in accordance with FIGS. 1-6, and a fixing tool 730.

In one example, the OHT system 740 includes a network of stationary tracks or rails 742 operable to guide the movement of one or more wheeled OHT vehicles 750 supported and suspended from the rails 742. In some embodiments, the rails 742 are monorails that are mounted to and suspended from the ceiling 780 and/or walls of the FAB. Rails 742 have any suitable cross-sectional configuration so long as the OHT vehicle 750 are appropriately supported from the rail 742 for rolling motion. An OHT vehicle 750 is operable to transport a wafer carrier 710 through the FAB 700 for intra-bay or inter-bay movement. The OHT vehicle 750 is configured and structured to hold a wafer carrier 710 housing a plurality of wafers and transport the wafer carrier 710 in a generally horizontal or lateral direction from one location to another within the FAB 700. The OHT vehicle 750 is configured and operable to pick up, raise/lower, hold, articulate, and release a wafer carrier 710. In one embodiment, the OHT vehicle 750 includes a motor-driven or pneumatic hoisting mechanism 752 generally comprised of gripper assembly including one or more retractable and extendable gripper arms having a gripper on the end thereof configured for locking onto a mating hook or flange on the wafer carrier 710. The hoisting mechanism 752 is operable to vertically raise and lower the gripper attached to wafer carrier 710.

As shown in FIG. 7, the OHT vehicle 750 can hold the wafer carrier 710, transport the wafer carrier 710 along the rail 742, and release the wafer carrier 710 onto a table of a load port of the wafer processing apparatus 721. As discussed above, the load port can load wafers from the wafer carrier 710 into the processing tool for wafer processing. While the wafer carrier 710 is placed at the wafer processing apparatus 721, an OCR device 760 on the wafer processing apparatus 721 may read an optical character, e.g. a wafer ID, disposed on a wafer loaded from the wafer carrier 710. Based on the read optical character, a controller on or coupled to the wafer processing apparatus 721 can determine whether the read optical character matches a predetermined character corresponding to the wafer. The predetermined character may be stored at the controller or at a database accessible to the controller.

In response to a determination that there is a mismatch between the optical character and the predetermined character, the controller of the wafer processing apparatus 721 may inform the OHT vehicle 750 to pick up the wafer carrier 710 from the wafer processing apparatus 721 and transport the wafer carrier 710 to the fixing tool 730 for fixing the mismatch. In response to a determination that there is no mismatch between the optical character and the predetermined character, the controller of the wafer processing apparatus 721 may record that the wafer passed a mismatch check of the optical character. Then after all wafers in the wafer carrier 710 are processed at the wafer processing apparatus 721 and pass the mismatch check, the OHT vehicle 750 can pick up the wafer carrier 710 from the wafer processing apparatus 721 and transport the wafer carrier 710 to the next wafer processing apparatus 722 for additional wafer processing and further mismatch checking, if necessary, as discussed above.

Figure 8:
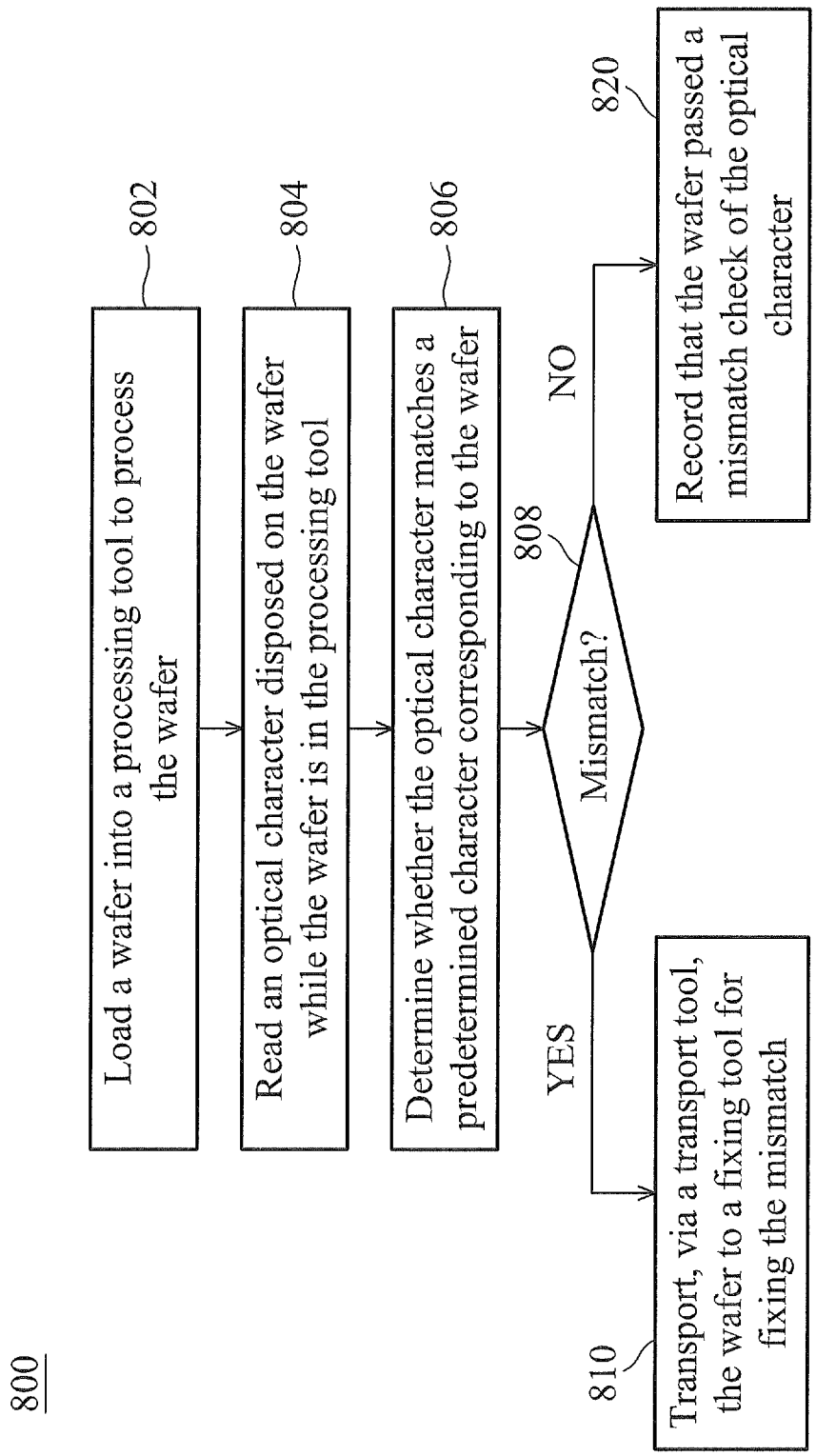
FIG. 8 is a flow chart illustrating an exemplary method for processing wafers and determining wafer characters, in accordance with some embodiments of the present disclosure.

FIG. 8 is a flow chart illustrating an exemplary method 800 for processing wafers and determining wafer characters, in accordance with some embodiments of the present disclosure. As shown in FIG. 8, a wafer is loaded at operation 802 into a processing tool to process the wafer. An optical character disposed on the wafer is read at operation 804 while the wafer is in the processing tool. It is determined at operation 806 whether the optical character matches a predetermined character corresponding to the wafer. Based on the determination result, if there is a mismatch found at operation 808, the process goes to operation 810 to transport, via a transport tool, the wafer to a fixing tool for fixing the mismatch. If there is no mismatch found at operation 808, the process goes to operation 820 to record that the wafer passed a mismatch check of the optical character.

Figure 9:
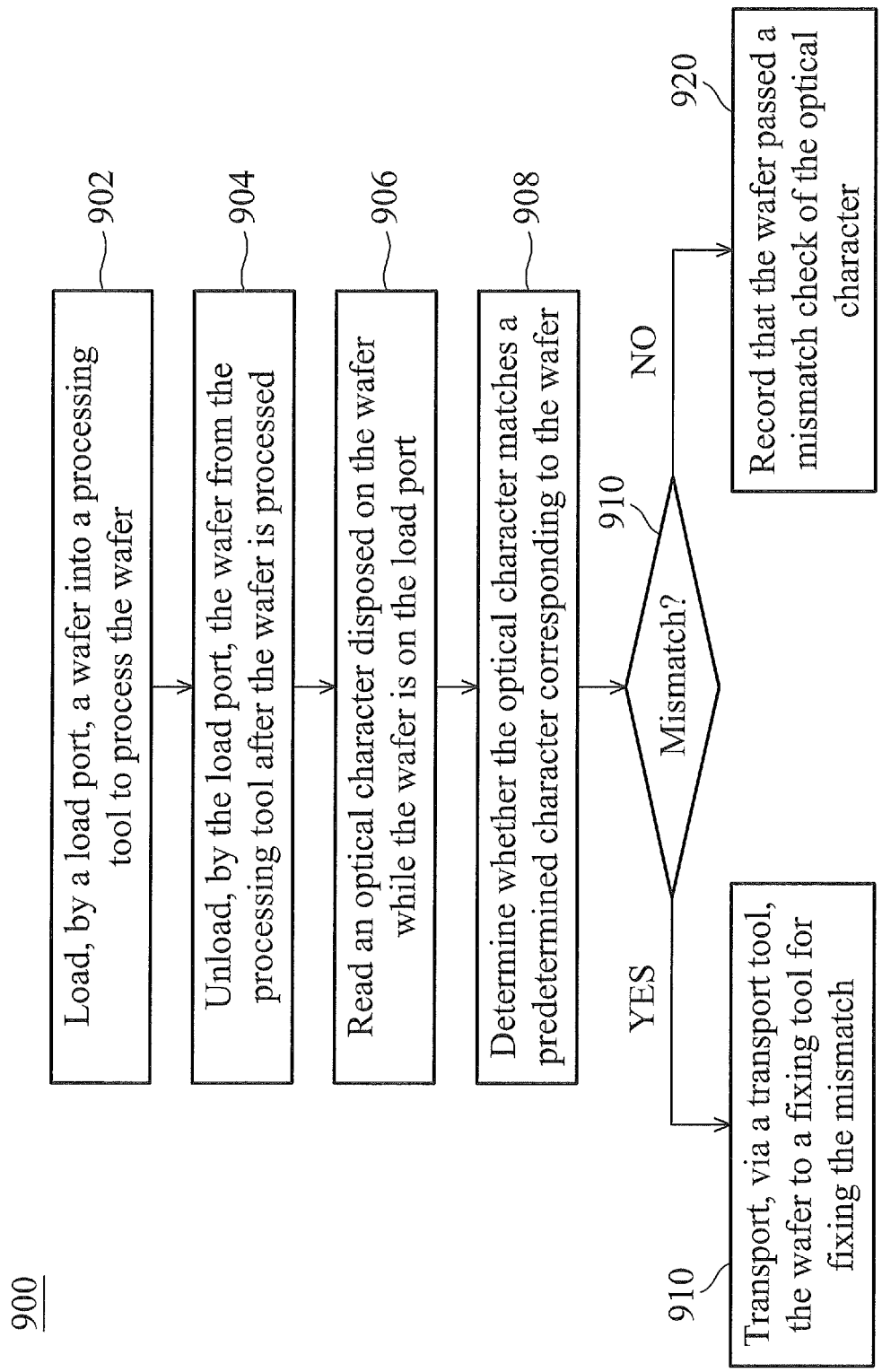
FIG. 9 is a flow chart illustrating another exemplary method for processing wafers and determining wafer characters, in accordance with some embodiments of the present disclosure.

FIG. 9 is a flow chart illustrating another exemplary method 900 for processing wafers and determining wafer characters, in accordance with some embodiments of the present disclosure. As shown in FIG. 9, a wafer is loaded at operation 902 by a load port into a processing tool to process the wafer. The wafer is unloaded at operation 904 by the load port from the processing tool after the wafer is processed. An optical character disposed on the wafer is read at operation 906 while the wafer is on the load port. It is determined at operation 908 whether the optical character matches a predetermined character corresponding to the wafer. Based on the determination result, if there is a mismatch found at operation 909, the process goes to operation 910 to transport, via a transport tool, the wafer to a fixing tool for fixing the mismatch. If there is no mismatch found at operation 909, the process goes to operation 920 to record that the wafer passed a mismatch check of the optical character. The order of the operations shown in each of FIG. 8 and FIG. 9 may be changed according to different embodiments of the present disclosure.

In an embodiment, an apparatus is disclosed. The apparatus includes: a processing tool configured to process a semiconductor wafer; a device configured to read an optical character disposed on the semiconductor wafer while the semiconductor wafer is located at the apparatus for wafer fabrication; and a controller configured to determine whether the optical character matches a predetermined character corresponding to the semiconductor wafer based on the optical character read in real-time at the apparatus.

In another embodiment, a method is disclosed. The method includes: loading a semiconductor wafer into a processing tool to process the semiconductor wafer; reading an optical character disposed on the semiconductor wafer while the semiconductor wafer is in the processing tool for wafer fabrication; and determining whether the optical character matches a predetermined character corresponding to the semiconductor wafer based on the optical character read in real-time during the wafer fabrication.

In yet another embodiment, a method is disclosed. The method includes: loading, by a load port, a semiconductor wafer into a processing tool to process the semiconductor wafer; unloading, by the load port, the semiconductor wafer from the processing tool after the semiconductor wafer is processed; reading an optical character disposed on the semiconductor wafer while the semiconductor wafer is on the load port before or after the semiconductor wafer is processed in the processing tool; and determining whether the optical character matches a predetermined character corresponding to the semiconductor wafer based on the optical character read while the semiconductor wafer is on the load port.

The foregoing outlines features of several embodiments so that those ordinary skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   loading, by a load port of a processing tool, a semiconductor wafer into the processing tool to process the semiconductor wafer;
   scanning the semiconductor wafer using an optical character recognition (OCR) device to read an optical character disposed on the semiconductor wafer in real-time as the semiconductor wafer is being turned by an orientator before the semiconductor wafer is processed in the processing tool, wherein the OCR device is located at the load port of the processing tool to scan the semiconductor wafer before the wafer is placed into a chamber of the processing tool for processing; and
   determining whether the optical character matches a predetermined character corresponding to the semiconductor wafer based on the optical character read.

2. The method of claim 1, wherein the predetermined character corresponding to the semiconductor wafer comprises an identification (ID) of the semiconductor wafer.

3. The method of claim 1, further comprising:
   in response to a determination that there is a mismatch between the optical character and the predetermined character, transporting, via a transport tool, the semiconductor wafer to a fixing tool for fixing the mismatch.

4. The method of claim 1, further comprising:
   in response to a determination that there is no mismatch between the optical character and the predetermined character, recording that the semiconductor wafer passed a mismatch check of the optical character.

5. The method of claim 1, further comprising:
   turning, by the orientator in the processing tool, the semiconductor wafer to a predetermined direction.

6. The method of claim 1, wherein:
the OCR device is configured to read the optical character based on an infrared light.

7. The method of claim 1, wherein:
the optical character comprises at least one of: typed text, handwritten text, or printed text.

8. The method of claim 1, further comprising:
unloading, by the load port, the semiconductor wafer from the processing tool after the semiconductor wafer is processed.

9. A method, comprising:
loading, by a load port of a processing tool, a semiconductor wafer onto a conveying mechanism within the processing tool configured to process the semiconductor wafer;
conveying the semiconductor wafer by the conveying mechanism onto an orientator within the processing tool;
scanning the semiconductor wafer using an optical character recognition (OCR) device to read an optical character disposed on the semiconductor wafer in real-time as the semiconductor wafer is being turned by an orientator before the semiconductor wafer is processed in the processing tool, wherein the OCR device is located at the load port of the processing tool to scan the semiconductor wafer before the wafer is placed into a chamber of the processing tool for processing; and
determining whether the optical character matches a predetermined character corresponding to the semiconductor wafer based on the optical character read; and
when it is determined that the optical character matches the predetermined character, moving the semiconductor wafer from the orientator into a processing chamber within the processing tool.

10. The method of claim 9, wherein the predetermined character corresponding to the semiconductor wafer comprises an identification (ID) of the semiconductor wafer.

11. The method of claim 9, further comprising:
in response to a determination that there is a mismatch between the optical character and the predetermined character, transporting, via a transport tool, the semiconductor wafer to a fixing tool for fixing the mismatch.

12. The method of claim 9, further comprising:
in response to a determination that there is no mismatch between the optical character and the predetermined character, recording that the semiconductor wafer passed a mismatch check of the optical character.

13. The method of claim 9, further comprising:
turning, by the orientator in the processing tool, the semiconductor wafer to a predetermined direction.

14. The method of claim 9, wherein:
the OCR device is configured to read the optical character based on an infrared light; and
the optical character comprises at least one of: typed text, handwritten text, or printed text.

15. The method of claim 1, further comprising:
unloading, by the load port, the semiconductor wafer from the processing tool after the semiconductor wafer is processed.

16. A method, comprising:
loading, by a load port, a semiconductor wafer onto a conveying mechanism within a processing tool configured to process the semiconductor wafer;
conveying the semiconductor wafer by the conveying mechanism onto an orientator within the processing tool;
scanning the wafer using an optical character recognition (OCR) device to read an optical character disposed on the semiconductor wafer in real-time as the semiconductor wafer is being turned by an orientator before the semiconductor wafer is processed in the processing tool, wherein the OCR device is located at the load port of the processing tool to scan the semiconductor wafer before the wafer is placed into a processing chamber of the processing tool for processing;
determining whether the optical character matches a predetermined character corresponding to the semiconductor wafer based on the optical character read;
modifying a gaseous pressure within a processing chamber within the processing tool;
determining when the gaseous pressure within the processing chamber reaches a predetermined level;
when it is determined that the optical character matches the predetermined character and the gaseous pressure within the processing chamber reaches the predetermined level, moving the semiconductor wafer from the orientator into the processing chamber within the processing tool;
performing a semiconductor manufacturing process on the semiconductor wafer while it is inside the processing chamber; and
unloading, by the load port, the semiconductor wafer from the processing tool after the semiconductor manufacturing process is completed.

17. The method of claim 16, wherein the predetermined character corresponding to the semiconductor wafer comprises an identification (ID) of the semiconductor wafer.

18. The method of claim 16, further comprising:
in response to a determination that there is a mismatch between the optical character and the predetermined character, transporting, via a transport tool, the semiconductor wafer to a fixing tool for fixing the mismatch.

19. The method of claim 16, further comprising in response to a determination that there is no mismatch between the optical character and the predetermined character, recording that the semiconductor wafer passed a mismatch check of the optical character.

20. The method of claim 16, wherein:
the OCR device is configured to read the optical character based on an infrared light; and
the optical character comprises at least one of: typed text, handwritten text, or printed text.

* * * * *